United States Patent
Foong et al.

(10) Patent No.: US 7,309,144 B2
(45) Date of Patent: Dec. 18, 2007

(54) STACKED LIGHT SOURCE

(75) Inventors: Kar Phooi Foong, Penang (MY); Mei Yen Goh, Penang (MY); Kok Peng Lim, Penang (MY)

(73) Assignee: Avago Technologies ECBU IP (Singapore) Pte Ltd, Singapore (SG)

( * ) Notice: Subject to any disclaimer, the term of this patent is extended or adjusted under 35 U.S.C. 154(b) by 29 days.

(21) Appl. No.: 10/945,734

(22) Filed: Sep. 21, 2004

(65) Prior Publication Data

US 2006/0062022 A1     Mar. 23, 2006

(51) Int. Cl.
*F21V 7/00* (2006.01)

(52) U.S. Cl. .................... 362/247; 362/800

(58) Field of Classification Search ......... 362/800, 362/247
See application file for complete search history.

(56) References Cited

U.S. PATENT DOCUMENTS

| | | | | |
|---|---|---|---|---|
| 5,813,753 | A * | 9/1998 | Vriens et al. | 362/293 |
| 6,692,136 | B2 * | 2/2004 | Marshall et al. | 362/231 |
| 7,012,283 | B2 * | 3/2006 | Tsuda et al. | 257/103 |
| 7,083,304 | B2 * | 8/2006 | Rhoads et al. | 362/293 |
| 7,128,444 | B2 * | 10/2006 | Isokawa et al. | 362/311 |
| 7,184,111 | B2 * | 2/2007 | Chua et al. | 349/71 |
| 2003/0227774 | A1 * | 12/2003 | Martin et al. | 362/240 |
| 2006/0198118 | A1 * | 9/2006 | Eichhorn et al. | 362/84 |

OTHER PUBLICATIONS

Techkon, "Color Measurement Technology for the Printing Industry." http://www.techkon.de/english/library/download/COLOR_E.PDF, 2002. Accessed: Aug. 25, 2006.*

* cited by examiner

*Primary Examiner*—Alan Cariaso
*Assistant Examiner*—Leah S. Lovell

(57) ABSTRACT

A light emitting device having two stacked light generators mounted in a reflector cup. In one embodiment the light generators emit complementary colors that mix to form white light.

10 Claims, 1 Drawing Sheet

STACKED LIGHT SOURCE

FIELD

This invention relates generally to the field of light sources. More particularly, this invention relates to a method and apparatus for mixing light from light sources.

BACKGROUND

Several approaches have been used to enable light emitting diodes (LEDs) to generate white light. A first approach is to use a blue LED in combination with a yellow phosphor. A portion of the blue light from the LED is converted into yellow light by the phosphor. The yellow light mixes with residual blue light to form white light. A disadvantage of this approach is the conversion efficiency of the phosphor is about 60%, so the light source is not efficient.

A second approach is to use a combination of LEDs of different colors to produce white light. In this approach, two or three LED dies are located side by side. For example, a blue LED may be used with an amber LED. However, with this approach it is difficult to obtain the accurate color mixing required to form white light.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
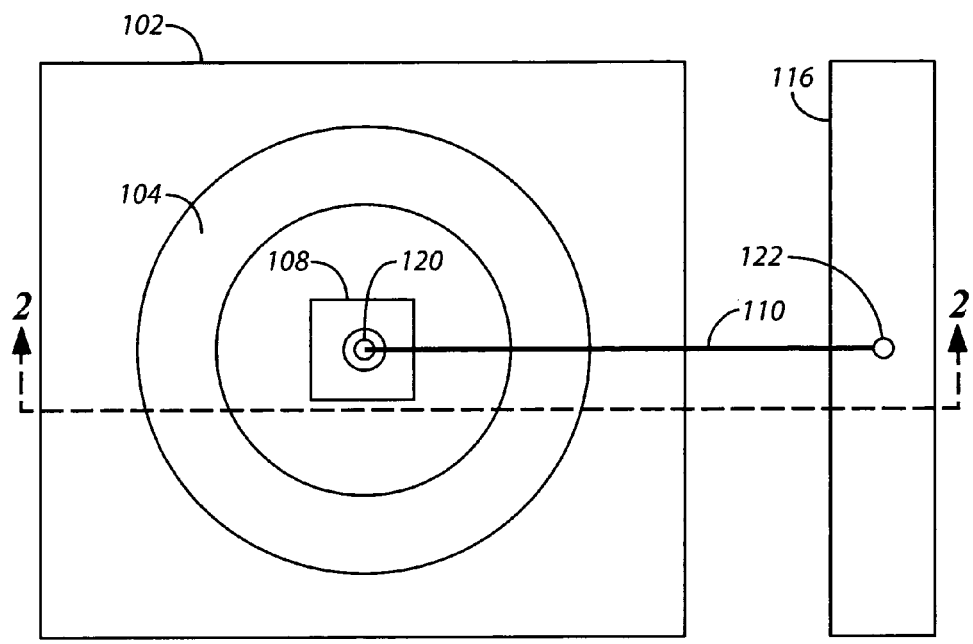
FIG. 1 is a top view of an embodiment of the invention

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to a light emitting device having two stacked light generators, such as light emitting diodes (LEDs) or laser diodes, mounted in a reflector cup. In one embodiment the light generators emit complementary colors that mix to form white light.

A top view of an embodiment of the present invention is shown in FIG. 1. Referring to FIG. 1, a reflector cup 104 is formed in the first lead frame or substrate 102. A second light generator 108 is mounted coaxially in the reflector cup. The second light generator 108 is mounted on top the first light generator (not shown in this view). An electrical connector 110 couples the second light generator 108 to a second lead frame 116. In this exemplary embodiment, the electrical connector 110 is attached to the second light generator and to the second lead frame by solder balls 120 and 122, respectively. The section 2-2 is shown in FIG. 2 and is described below.

Stacking the light generators within the reflector cup results in improved mixing of the light from light generators.

Figure 2:
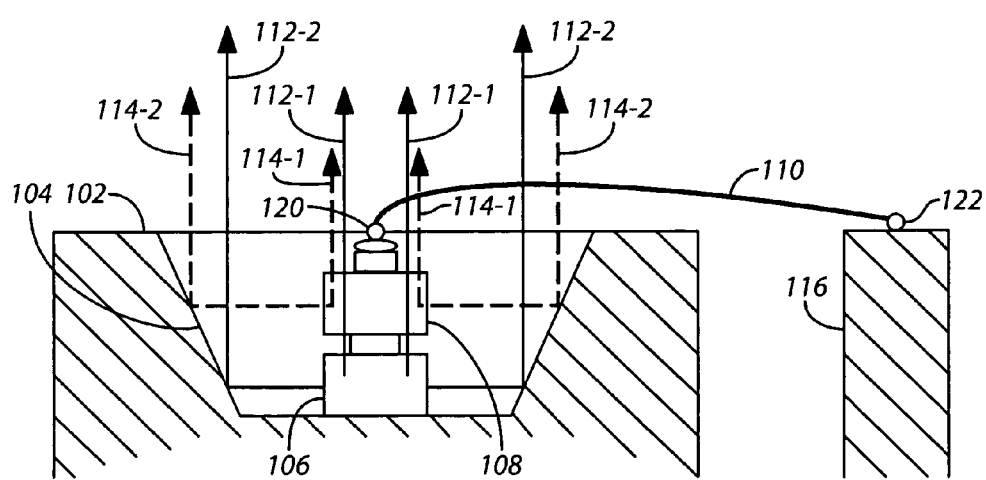
FIG. 2 is a sectional view of an embodiment of the invention.

FIG. 2 is a sectional view through a first lead frame or substrate 102. The first lead frame or substrate 102 contains a reflector cup or well 104. Mounted on the base of the reflector cup 104 is a first light generator 106. Mounted on the first light generator 106 is a second light generator 108. Electrical power to the first and second light generators is provided through the first lead frame or substrate 102 and through an electrical connector 110. The electrical connector 110 may be a wire bond coupled to a second lead frame 116, for example. The first and second light generators are electrically coupled, so that the second light generator 108 is electrically coupled to the first lead frame or substrate 102 via the first light generator 106 and the first light generator 106 is electrically coupled to the second lead frame 116 via the second light generator 108 and the wire bond 110.

The first light generator 106 emits light 112-1 and 112-2 of a first wavelength or color. A first portion of this light 112-1 is radiated directly, while a second portion of the light 112-2 is reflected from the surface of the reflector cup 104 before being radiated. The second light generator 108 emits light 114-1 and 114-2 of a second wavelength or color. A first portion 114-1 of the light is radiated directly, while a second portion 114-2 of the light is reflected from the surface of the reflector cup 104 before being radiated.

The shape of the reflector cup 104 may be chosen to control the spatial distribution of the reflected light (112-2 and 114-2). Further, the shape of the reflector cup 104 may be chosen to control the mixing of the first light 112-1 and 112-2 and the second light 114-1 and 114-2. The reflector cup may be shaped as a cone or a paraboloid, for example. When a paraboloid is used, the first and second light generators may be placed either side of the focal point of the paraboloid.

In one embodiment of the invention, the first and second light generators are chosen such that the first light 112-1 and 112-2 and second light 114-1 and 114-2 mix to form white light. The colors of the first and second light generators may be chosen to be binary complements in accordance with a C.I.E. (Commission Internationale d'Eclairage) color chart. For example, a blue light generator may be used with an amber light generator, a cyan light generator may be used with a red-orange light generator, or a green light generator may be used with a red light generator.

The light generators 106 and 108 are positioned in close proximity to one another to maximize the mixing of the first light with the second light. This may be facilitated by reducing the thickness of the light generators. In one embodiment, the first and second light generators are aligned coaxially with the reflector cup 104.

It will be apparent to those of ordinary skill in the art that one or more additional light generators may be stacked. For example, red, green and blue light generators may be stacked in the reflector cup.

It will also be apparent that the stacked light generators may also be used in conjunction with phosphor materials.

While the invention has been particularly shown and described with reference to a preferred embodiment, it will be understood by those skilled in the art that various changes in form and detail may be made therein without departing from the spirit and scope of the invention. Accordingly, it is intended that the present invention embrace all such alternatives, modifications and variations as fall within the scope of the appended claims.

What is claimed is:

1. A lighting device package far producing visible light, comprising:
   a) a first lead frame comprising a substrate;
   b) a second lead frame comprising an electrical connector;
   c) a reflector formed in the substrate and comprising a base and having a centrally-disposed optical axis associated therewith, the reflector being configured to direct light incident thereon and reflected therefrom forwardly and outwardly away therefrom;
   d) a first solid-state light emitter mounted at the base of the reflector, aligned with the optical axis and electrically connected to the substrate, the first light emitter being configured to emit light of a first color both forwardly and away from the reflector and laterally and backwardly towards the reflector for reflection therefrom;
   e) a second solid-state light emitter mounted above the first light emitter, aligned with the optical axis and electrically connected to the first light emitter and the second lead frame via the electrical connector, the second light emitter being configured to emit light of a second color both forwardly and away from the reflector and laterally and backwardly towards the reflector for reflection therefrom;
wherein the reflector, the first light emitter and the second light emitter are configured to mix light of the first color and the second color to produce visible light emitted by the package, and wherein the first color and the second colors are binary complements according to the C.I.E. color chart.

2. A lighting device package for producing visible light in accordance with claim 1, wherein the light of the first color and light of the second color mix to form white light.

3. A lighting device package for producing visible light in accordance with claim 1, wherein the reflector is shaped to maximize mixing of the light of the first color with the light of the second color.

4. A lighting device package for producing visible light in accordance with claim 1, wherein at least one of the first light emitter and the second light emitter is a light emitting diode semiconductor die.

5. A lighting device package for producing visible light in accordance with claim 1, wherein at least one of the first light emitter and the second light emitter is a laser diode.

6. A method for packaging a light source, comprising:
   a) providing a first lead frame comprising a substrate;
   b) providing a second lead frame comprising an electrical connector;
   c) forming a reflector in the substrate, the reflector comprising a base and having a centrally-disposed optical axis associated therewith, the reflector being configured to direct light incident thereon and reflected therefrom forwardly and outwardly away therefrom;
   d) providing a first solid-state light emitter and mounting same at a base of the reflector in alignment with the optical axis, the first light emitter being configured to emit light of a first color both forwardly and away from the reflector and laterally and backwardly towards the reflector for reflection therefrom
   e) electrically connecting the first light emitter to the substrate;
   f) providing a second solid-state light emitter and mounting same above the first light emitter in alignment with the optical axis, the second light emitter being configured to emit light of a second color both forwardly and away from the reflector and laterally and backwardly towards the reflector for reflection therefrom; and
   g) electrically connecting the second light emitter to the first light emitter and the second lead frame via the electrical connector;
wherein the reflector, the first light emitter and the second light emitter are configured to mix light of the first color and the second color to produce visible light, and wherein the first color and the second color are binary complements according to the C.I.E. color chart.

7. A method in accordance with claim 6, further comprising mounting a third light generator, operable to emit light of a third color, on the second light generator such that the second light generator is electrically coupled to the third light generator.

8. A method in accordance with claim 6, wherein the light of the first color and the light of the second color combine to form white light.

9. A method in accordance with claim 6, wherein a light generator of the first and second light generators is a light emitting diode semiconductor die.

10. A method in accordance with claim 6, wherein a light generator of the first and second light generators is a laser diode.

* * * * *